US007252875B2

(12) United States Patent
Cohen et al.

(10) Patent No.: US 7,252,875 B2
(45) Date of Patent: *Aug. 7, 2007

(54) DIFFUSION BARRIER WITH LOW DIELECTRIC CONSTANT AND SEMICONDUCTOR DEVICE CONTAINING SAME

(75) Inventors: Stephan A. Cohen, Wappingers Falls, NY (US); Stephen McConnell Gates, Ossining, NY (US); Alfred Grill, White Plains, NY (US); Vishnubhai V. Patel, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 599 days.

This patent is subject to a terminal disclaimer.

(21) Appl. No.: 10/320,111

(22) Filed: Dec. 16, 2002

(65) Prior Publication Data

US 2004/0115407 A1 Jun. 17, 2004

(51) Int. Cl.
*B32B 9/00* (2006.01)
(52) U.S. Cl. .................. 428/304.4; 428/698; 428/446; 106/287.16
(58) Field of Classification Search ............ 428/304.4, 428/446, 698; 106/287.16
See application file for complete search history.

(56) References Cited

U.S. PATENT DOCUMENTS 6,194,328 B1 * 2/2001 Chen et al. ................. 438/775
6,284,657 B1 * 9/2001 Chooi et al. ............... 438/687
6,417,092 B1 * 7/2002 Jain et al. .................. 438/624
6,602,806 B1 * 8/2003 Xia et al. ................... 438/786
6,784,485 B1 * 8/2004 Cohen et al. ............... 257/325

FOREIGN PATENT DOCUMENTS

JP 08130248 A * 5/1996

OTHER PUBLICATIONS

U.S. Appl. No. 09/502,729, filed on Feb. 11, 2000.

* cited by examiner

*Primary Examiner*—Jennifer McNeil
(74) *Attorney, Agent, or Firm*—Scully, Scott, Murphy & Presser, P.C.; Robert M. Trepp, Esq.

(57) ABSTRACT

A diffusion barrier useful in semiconductor electronic devices, such as multi-level interconnect wiring structures, is provided. The diffusion barrier is characterized as having a low-dielectric constant of less than 3.5, preferably less than 3.0, as well as being capable of substantially preventing Cu and/or oxygen from diffusing into the active device areas of the electronic device. Since the diffusion barrier has a low-dielectric constant, the diffusion barrier has only a minor effect on the effective dielectric constant of the interconnect structure. The low-k diffusion barrier includes atoms of Si, C, H and N. The N atoms are non-uniformly distributed within the low-k diffusion barrier. Optionally, the low-k diffusion barrier may include atoms of Ge, O, halogens such as F or any combination thereof.

9 Claims, 8 Drawing Sheets

DIFFUSION BARRIER WITH LOW DIELECTRIC CONSTANT AND SEMICONDUCTOR DEVICE CONTAINING SAME

DESCRIPTION

1. Field of the Invention

The present invention relates to a diffusion barrier having a low-dielectric constant (on the order of less than 3.5), the method of fabricating such a diffusion barrier and electronic devices that contain the inventive diffusion barrier therein. More particularly, the present invention provides a low-dielectric constant barrier to copper (i.e., Cu) and/or oxygen diffusion that is useful in back-end-of-the-line (BEOL) wiring structures of very large scale integration (VLSI) devices.

2. Background of the Invention

Generally, semiconductor devices include a plurality of integrated circuits (ICs). ICs can be useful for many applications including computers and electronic equipment and they can contain millions of transistors and other circuit elements that can be fabricated on a single semiconductor chip. For device functionality, a complex of signal paths will typically be routed to connect the circuit elements distributed on the surface of the semiconductor device. Efficient routing of these signals across the device can become more difficult as the complexity and number of ICs are increased. Thus, the formation of multi-level or multi-layered interconnect schemes have become more desirable due to their efficacy in providing high-speed signal routing patterns between a large number of transistors on a single semiconductor chip. The preferred interconnect metal is copper, and the preferred fabrication method is the dual damascene approach.

In fabricating IC wiring with a multi-level scheme, an insulating material (oftentimes referred to as a dielectric material) such as $SiO_2$, will normally be patterned with several thousand openings to create openings for conductive lines and/or vias using photolithography and etching. These openings formed into the dielectric material are typically filled with a conductive material such as Cu or Al to interconnect the active device regions of the ICs. After the filling process, the semiconductor device is generally planarized.

A diffusion barrier layer formed from, e.g., $Si_3N_4$ with the nitrogen being uniformly distributed throughout the layer, is then typically formed over the planarized surface featuring the dielectric material and the conductive filled vias and lines. Next, a second dielectric material is formed over the diffusion barrier layer and openings for vias and lines are created in the second dielectric material as discussed above. Another conductive material is then formed within the openings, the structure is planarized and another diffusion barrier layer is then formed atop the planarized structure. A third dielectric may be formed atop the barrier layer and then the process described above may be repeated to fabricate a multi-level interconnect wiring structure.

The prior art $Si_3N_4$ diffusion barrier layers function as an adhesive keeping the successive layers of the multi-level interconnect wiring structure together. Despite their adhesive properties, prior art $Si_3N_4$ diffusion barrier layers do not provide optimum adhesion thereby causing the risk of delamination in the semiconductor device during device fabrication or service. Additionally, the prior art $Si_3N_4$ diffusion barrier layers cause the semiconductor device to posses a relatively high-effective dielectric constant, on the order of about 6-7, thereby resulting in a higher capacitance between the conductive metal lines and vias causing the electric signals to travel at a slower speed with increased cross-talk through the multi-level interconnect wiring structure.

In view of the drawbacks mentioned above with prior art diffusion barriers, there is a continued need for developing a new and improved diffusion barrier that can provide robust adhesion between the interconnect layers while also maintaining a relatively low dielectric constant such that when the diffusion barrier is used in an electronic device, such as, for example, an interconnect wiring structure, the diffusion barrier does not significantly increase the overall effective dielectric constant of the structure.

SUMMARY OF THE INVENTION

The present invention provides a novel diffusion barrier useful in semiconductor electronic devices. The inventive diffusion barrier is characterized as having a low-dielectric constant of less than 3.5, preferably less than 3.0, as well as being capable of substantially preventing Cu and/or oxygen from diffusing into the active device areas of the electronic device. Since the inventive diffusion barrier has a low-dielectric constant, the inventive diffusion barrier has only a minor effect on the effective dielectric constant of the interconnect structure. The inventive low-k diffusion barrier includes atoms of Si, C, H and N. The N atoms are non-uniformly distributed within the low-k diffusion barrier. Optionally, the inventive low-k diffusion barrier may include atoms of Ge, O, halogens such as F or any combination thereof.

Specifically, the present invention provides a composition of matter including atoms of at least Si, C, H and N, said N atoms being non-uniformly distributed within the composition and said composition having a dielectric constant of less than 3.5 and being capable of substantially preventing Cu and/or oxygen from diffusing therethrough. The inventive composition of matter may optionally include Ge, O and/or halogens.

In some embodiments, the nitrogen atoms are present in an upper surface region of the diffusion barrier. In yet another embodiment, the nitrogen atoms are located in an upper and a lower surface region of the diffusion barrier. In still yet another embodiment of the present invention, the nitrogen atoms are located in upper, middle and lower regions of the diffusion barrier.

The present invention also provides an electronic device, such as an interconnect wiring structure, that includes at least the inventive diffusion barrier. Specifically, the inventive electronic device comprises:

a substrate containing a plurality of conductive elements; and a diffusion barrier having a dielectric constant of less than 3.5 located atop at least a portion of the substrate, said diffusion barrier comprising atoms of at least Si, C, H and N and is capable of substantially preventing Cu and/or oxygen from diffusing therethrough, said N atoms being non-uniformly distributed within the diffusion barrier.

The present invention also provides a method of fabricating the inventive diffusion barrier onto an electronic device. Specifically, the inventive method includes the steps of:

positioning a substrate containing a plurality of conductive elements in a reactor chamber of a parallel plate plasma enhanced chemical vapor deposition reactor;

flowing a precursor gas containing a mixture of molecules comprising atoms of at least Si, C and H and organic molecules into the reactor chamber;

forming a dielectric film comprising a first phase comprised of atoms of at least Si, C and H onto at least a portion of said substrate utilizing at least said precursor gas;

exposing the dielectric film to a plasma so as to densify a top layer of the dielectric film;

introducing nitrogen atoms at least into a portion of the densified dielectric film; and annealing to convert said dielectric film into a diffusion barrier that includes a layer containing Si, C, H and optionally O and a second layer comprised of atoms of at least Si, C, H and N, said diffusion barrier having a dielectric constant of less than 3.5 and said N atoms are non-uniformly distributed within the diffusion barrier.

Examples of preferred precursor gas mixtures that can be used in the present invention include: trimethylsilane/paraxylene or trimethylsilane/cyclopentene oxide and optionally He or other diluent gas such as $CO_2$.

DETAILED DESCRIPTION OF THE INVENTION

Figure 1A:
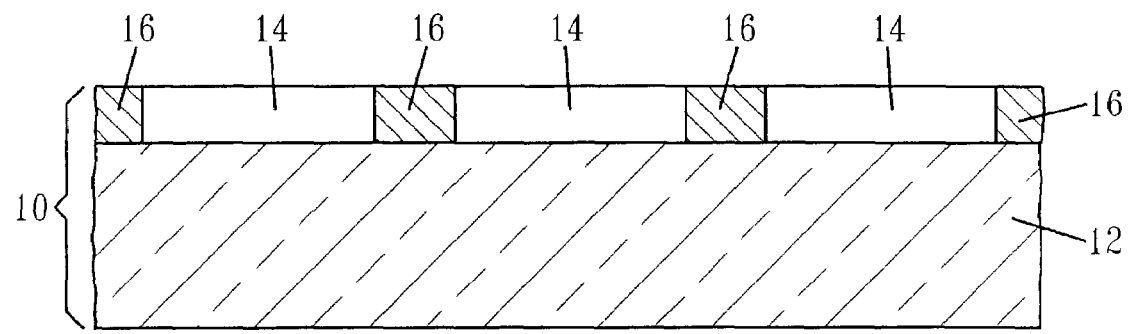
FIGS. 1A-1J are pictorial representations (through cross-sectional views) illustrating the basic processing steps which are employed in the present invention.

The present invention, which provides a novel diffusion barrier for electronic devices, as well as the electronic devices containing the same and methods of fabricating the inventive diffusion barrier, will now be described in greater detail by referring to the drawings that accompany the present application.

In the following discussion, the electronic device is a multi-level interconnect wiring structure. Although the discussion that follows is directed to a multi-level interconnect wiring structure the present invention works well for any electronic device that includes a substrate containing a plurality of conductive regions. In the illustrated multi-level interconnect wiring structure, the inventive diffusion barrier serves as a Cu and/or oxygen diffusion cap.

Reference is first made to FIG. 1A, which illustrates an initial substrate (labeled as element 10) that is employed in the present invention. Initial substrate 10 comprises a semiconductor wafer 12 that includes dielectric layer 14 having a plurality of conductive elements 16 formed within openings that are located within the dielectric layer.

The semiconductor wafer may include any number of active and/or passive devices (or regions) located within the wafer or on a surface thereof. For clarity, the active and/or passive devices (or regions) are not shown in the drawings, but are nevertheless meant to be included with wafer 12. The initial substrate is composed of materials well known to those skilled in the art, and conventional processes are employed in fabricating the initial structure.

For example, the semiconductor wafer may comprise any conventional semiconductor material including, but not limited to: Si, Ge, SiGe, SiC, SiGeC, InAs, GaAs, InP and other III/V compound semiconductors. The semiconductor wafer may also be composed of a silicon-on-insulator (SOI) material that includes a buried insulating region, such as a buried oxide region, which electrically isolates a top SOI material layer from a bottom Si-containing substrate.

Dielectric layer 14 is formed atop the semiconductor wafer utilizing a conventional deposition process such as chemical vapor deposition (CVD), plasma-assisted CVD, evaporation, spin-on coating, or chemical solution deposition. The thickness of dielectric layer 14 may vary and is of no real importance to the present invention.

Dielectric layer 14 includes any suitable insulating material that is typically employed as an interlevel or intralevel dielectric. This includes inorganic dielectrics, organic dielectrics and combinations, including, multilayers thereof. Illustrative examples of suitable materials for dielectric layer 14 include, but are not limited to: $SiO_2$, fluorinated $SiO_2$, organic thermoset or thermoplastic dielectrics such as polyimides, polyarylenes, benzocyclobutenes and the like, spun-on glasses, with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H. Preferred insulating materials for dielectric layer 14 are organic or SiCOH dielectrics.

After forming dielectric layer 14 on a surface of semiconductor wafer 12, openings are formed into the dielectric layer so as to expose portions of the underlying semiconductor wafer. The openings are formed utilizing conventional lithography and etching. The lithographic step includes applying a photoresist to the dielectric layer, exposing the photoresist to a pattern of radiation and developing the pattern into the exposed photoresist utilizing a conventional resist developer. The etching step used in providing the openings into dielectric layer 14 includes chemical reactive ion etching (RIE), plasma etching, ion beam etching or laser ablation. Following etching, the photoresist is typically removed from the structure utilizing a conventional resist stripping process.

Conductive material, such as Ti, TiN, TiW, Ta, TaN, W, Al, Pd, Cu and the like, as well as combinations thereof, are then formed utilizing a conventional deposition process, such as plating or sputtering, filling at least the openings. A highly preferred conductive material used in the present application is Cu. In some instances, conductive material is also formed atop the patterned dielectric layer during the filling process. After filling the openings with a conductive material, the structure is typically subjected to a conventional planarization process, such as chemical-mechanical polishing or grinding, to provide a planar structure containing conductive elements 16 such as shown, for example, in FIG. 1A. Note that each top surface of conductive element 16 is substantially coplanar with the abutting top surface of dielectric layer 14.

Typically, the exposed surface of conductive elements 16 will contain contaminants such as, for example, oxides of the metal conductor, which can lead to inferior adhesion of the inventive diffusion barrier to the conductive elements. Thus, it is preferred, but not required, in the present invention to remove substantially all of the contaminants prior to formation of the diffusion barrier. The removal of substantially all of the contaminants is carried out at this point of the inventive process by subjecting the substrate shown in FIG. 1A to plasma cleaning by injecting a gas flow of, e.g., pure $NH_3$ or a gas mixture containing a nitrogen-containing gas such as, for example, $N_2$ or $NH_3$, with optional other gases into the parallel plate CVD reactor (to be discussed in greater detail hereinbelow) to form a plasma which advantageously removes substantially all of the contaminants. Alternatively, a gas mixture containing hydrogen, helium or argon may be used for cleaning.

It is particularly advantageous to employ a nitrogen-containing gas mixture because during plasma etching thin nitrogen-containing film 18 (See FIG. 1B) is formed on the top surfaces of the dielectric layer and the conductive elements. This thin nitrogen-containing film may form the lower part of the inventive diffusion barrier since it has been found that the presence of the same improves the adhesion of the barrier layer to the structure. It has also been determined that this thin film also renders the top surface of the conductive elements resistant to oxidation by air. It has been found that a substrate temperature of about 200° to about 500° C. can accelerate and assist in formation of the nitrogen-containing film. Generally, when applying this film, the nitrogen-containing film will have (1) a nitrogen content of about 1 to about 20, preferably about 5 to about 10, atomic percent, and (2) a nitrogen:carbon ratio of about 0.1 to about 0.5, preferably less than about 0.2, atomic percent.

It is understood that small amounts of oxygen, e.g., in an amount of less than about 5 atomic percent, preferably less than about 2 atomic percent, may optionally be present in film 18 due to exposure to air or another source of oxygen. The thickness of film 18 will typically be from about 1 to about 10 nm and, preferably from about 2 to about 4 nm. A thin film is required herein since the greater the thickness of the film the greater amount of nitrogen will be present in the film which will result in a higher dielectric constant of the interconnect wiring structure. The temperature and power employed in this optional step of the present invention can range from about 200° to about 500° C. at a power from about 100 to 1000 watts. The time period for removing the contaminants and forming thin nitrogen film 18 will generally not exceed about 120 seconds.

Figure 1B:
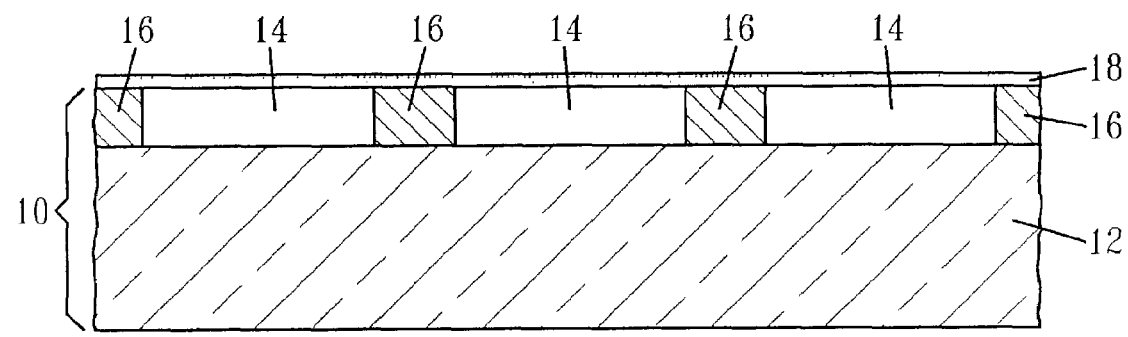
Figure 1C:
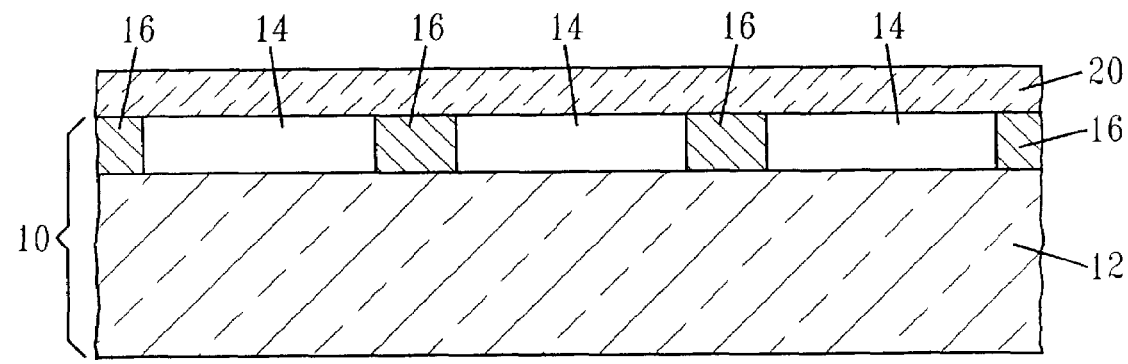

After forming the initial substrate shown in FIG. 1A (or alternatively FIG. 1B), dielectric film 20 is formed atop the substrate providing the structure shown, for example, in FIG. 1C. In the drawings that follow, the optional thin nitrogen-containing film is not shown, however, the various processing steps of the present invention work equally well with the structure shown in FIG. 1B.

The dielectric film formed at this point of the present invention is a film having a first phase comprised of atoms of at least Si, C and H. The dielectric film may optionally include atoms of Ge, O and/or halogens such as F. The dielectric film has a deposited thickness of from about 10 to about 100 nm, with a deposited thickness of from about 20 to about 80 nm being more highly preferred. Dielectric film 20 is an amorphous film which may further comprise a multiplicity of nanometer-sized pores. The pores comprise between 0 and 50%, preferably between 0 and 30% of the film's volume. The diameters of these pores are between 0.2 and about 10 nm, and preferably between 0.2 and 4 nm.

The dielectric film typically contains from about 10 to about 40, more preferably from about 20 to about 35 atomic percent Si; from about 15 to about 50, more preferably from about 25 to about 40, atomic percent C; and from about 25 to about 50, more preferably from about 30 to about 45, atomic percent H. The optional element oxygen is present in an amount from about 1 to about 15, more preferably from about 5 to about 10, atomic percent. The optional atoms Ge and/or halogen are present in an amount from about 1 to about 10, more preferably about 5, atomic percent.

Dielectric film 20 having the first phase is formed by placing the substrate shown in FIG. 1A into a reactor chamber of a parallel plate chemical vapor deposition (CVD) apparatus. Any suitable parallel plate CVD apparatus can be used in the present invention. In the case of FIG. 1B, that structure is already present in the reactor chamber. In FIG. 1B, dielectric film 20 would be formed atop thin nitrogen-containing film 18.

Figure 2:
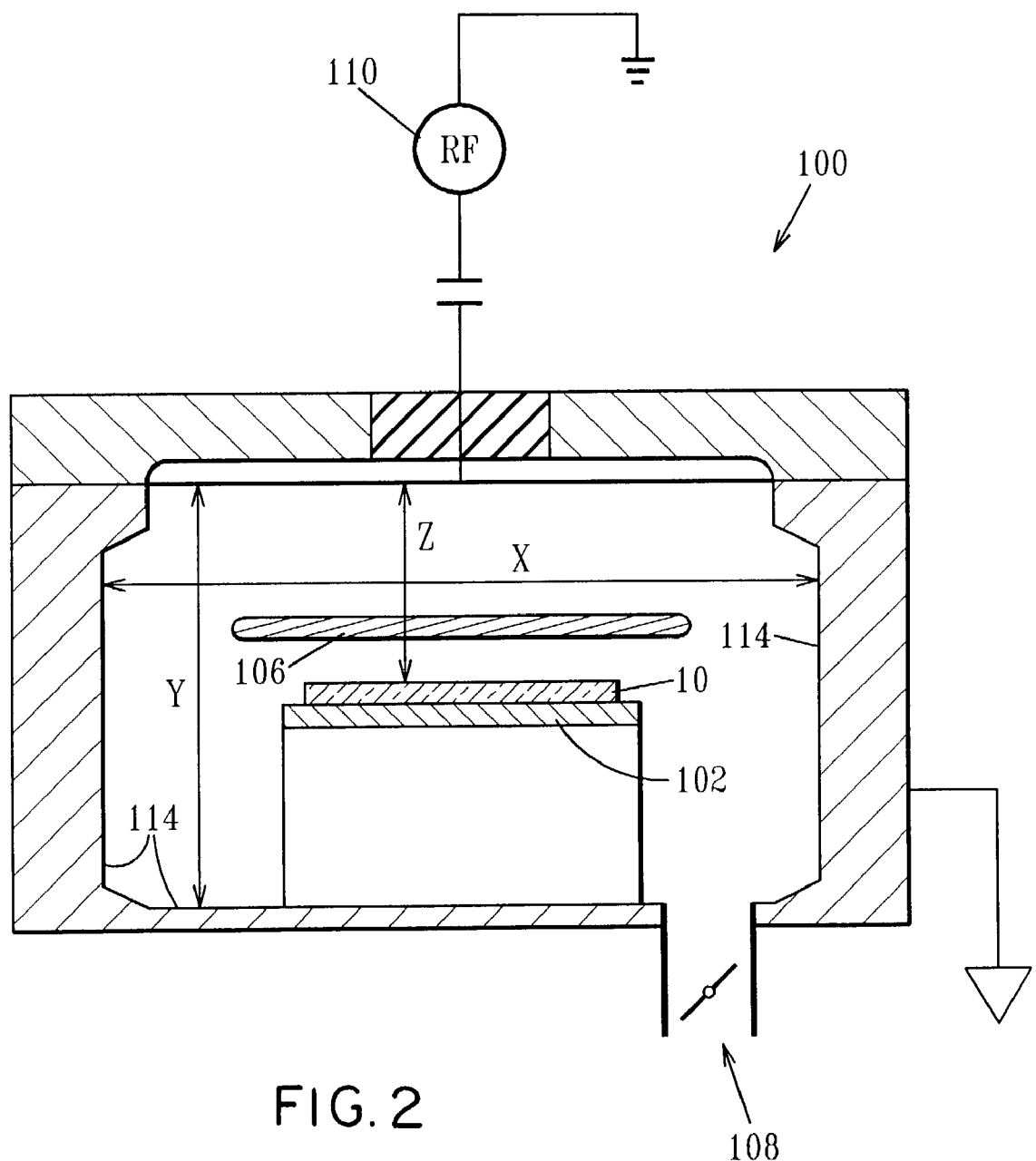
FIG. 2 is a schematic representation of a parallel plate chemical vapor deposition reactor that can be employed in the present invention.

FIG. 2 is a schematic of a typical parallel plate CVD reactor that can be employed in the present invention. The parallel plate CVD reactor (labeled as element 100) is the kind generally used in processing 200 mm wafers. The inner diameter, X, of the reactor 100 is approximately 13 inches, while its height, Y, is approximately 8.5 inches. The diameter of substrate chuck 102 is approximately 10.8 inches. The foregoing values may vary and are provided only for illustrative purposes. Reactant gases are introduced into reactor 100 through a gas distribution plate ("GDP") 106 that is spaced apart from substrate chuck 102 by a gap Z of about 1 inch, and are exhausted out of reactor 100 through exhaust port 108. RF power 110 is connected to GDP 106, which is electrically insulated from reactor 100, and substrate chuck 102 is grounded. For practical purposes, all other parts of the reactor are grounded.

In a different embodiment, RF power 110 can be connected to substrate chuck 102 and transmitted to substrate 10. In this case, the substrate acquires a negative bias, whose value is dependent on the reactor geometry and plasma parameters. In another embodiment, more than one electrical power supply can be used. For instance, two power supplies can operate at the same RF frequency, or one may operate at a low frequency and one at a high frequency. The two power supplies may be connected both to the same electrode or to separate electrodes. In another embodiment, the RF power supply can be pulsed on and off during deposition. Process variables controlled during deposition of the dielectric film are RF power, precursor mixture and flow rate, pressure in reactor, and substrate temperature.

Surfaces 114 of reactor 100 may be coated with an insulating coating material. For instance, one specific type of coating is applied on reactor walls 114 to a thickness of several mils. Another type of coating material that may be used on substrate chuck 102 is a thin coating of alumina or other insulator resistant to etching with an oxygen plasma. The temperature of the heated wafer chuck controls the substrate temperature.

In accordance with the present invention, dielectric film 20 is formed by first flowing a precursor gas mixture of molecules comprising atoms of at least Si, C and H, optionally Ge, O, halogen with organic molecules and optionally another diluent gas into the reactor chamber containing the substrate shown in FIG. 1A. Specifically, the precursor gas mixture includes an admixture of a first precursor gas, a second precursor gas, and a diluent gas, which is injected into the reactor chamber to form dielectric layer 20. The diluent gas can be an inert gas such as He or Ar or a gas with low reactivity such as $CO_2$, or can be a mixture of these gases.

The first precursor gas is any gas such as an organosilane which includes atoms of Si, C and H, optionally O. The organosilanes that are employed in the present invention may be characterized by the following formula: $H_{4-x}SiR_x$ wherein each R is the same or different and is a $C_{1-22}$ alkyl, $C_{2-22}$ alkenyl, $C_{2-22}$ alkynyl or an alkoxy containing from 1 to 22 carbon atoms; and x is a number from 0-4. The R groups of the organosilane may be linear or branched, substituted or unsubstituted, and/or cyclic. Examples of suitable organosilanes include, but are not limited to: methylsilane, dimethylsilane, trimethylsilane, tetramethylsilane, dimethyldimethoxysilane, ethylsilane, various substituted ethylsilanes, tetramethylcyclotetrasiloxane and the like. A further description of other types of materials that can be employed in the present invention as the first precursor gas can be found in co-assigned U.S. application Ser. No. 09/938,949, the entire content of which is incorporated herein by reference.

In accordance with the present invention, the precursor gas mixture also includes a second organic precursor gas which contains atoms of C and H (e.g., a hydrocarbon gas) and optionally O, F and N. Examples of second precursors gases that can be employed in the present invention, include, but are not limited to: methane, ethylene, acetylene, cyclohexane, toluene, xylenes including paraxylene, cyclopentene oxide, cyclohexene oxide, cyclooctene oxide, 1,4-epoxycylohexene oxide and the like. A further description of other types of materials that can be employed in the present invention as the second precursor gas can be found in co-assigned U.S. application Ser. No. 09/938,949, the entire content of which is incorporated herein by reference. In the '949 application, the organic molecules containing C, H and O atoms and at least one ring can be used in the present invention as the second precursor gas.

In some embodiments, the first precursor may further be mixed with $CO_2$ or He as a carrier gas or the first and second precursor gases may be mixed with $CO_2$ or He or a mixture of $CO_2$ and $O_2$ in the PECVD reactor. The addition of $CO_2$ to the first precursor as a carrier gas, or the addition of He or $CO_2$ or a mixture of $CO_2$ and $O_2$ to the first and second precursors in the PECVD reactor provides a stabilizing effect on plasma in the PECVD reactor and improves the uniformity of the film deposited on the substrate. When He or $CO_2$ is admixed with the first and second precursors, the amount of He or $CO_2$ may be from about 25 sccm to about 10000 sccm, and more preferably from about 50 sccm to about 5000 sccm. When a mixture of $CO_2$ and $O_2$ is admixed with the first and second precursors, the amount of $CO_2$ admixed may be from about 25 sccm to about 10000 sccm and the amount of $O_2$ admixed may be from about 0.5 sccm to 500 sccm. More preferably, the amount of $CO_2$ is from about 50 sccm to about 5000 sccm and the amount of $O_2$ is from about 1 sccm to about 300 sccm. Within the invention, mixtures of $CO_2$ with He, Ar, Ne, Kr, or Xe may be used.

The main process variables controlled during the deposition of the dielectric film are the RF power, the flow rates of the first and second precursors and diluent gas, the reactor pressure and the substrate temperature. The deposition conditions utilized are critical to enable a successful implementation of the deposition process according to the present invention. For instance, a wafer temperature of between about 25° C. and about 325° C., and preferably of between about 60° C. and about 200° C. is utilized. A RF power density between about 0.05 W/cm$^2$ and about 4.0 W/cm$^2$, and preferably between about 0.25 W/cm$^2$ and about 2 W/cm$^2$ is utilized.

A reactant gas flow rate of first precursor gas between about 5 sccm and about 1000 sccm, and preferably between about 25 sccm and about 200 sccm is utilized. A reactant gas flow rate of second precursor gas between about 5 sccm and about 1000 sccm, and preferably between about 10 sccm and about 120 sccm is utilized. A diluent gas, inert or $CO_2$ may be further added to the gas mixtures in amounts described above. Reactor pressure during the deposition process between about 50 mTorr and about 5000 mTorr, and preferably between about 100 mTorr and about 3000 mTorr is utilized.

Figure 1D:
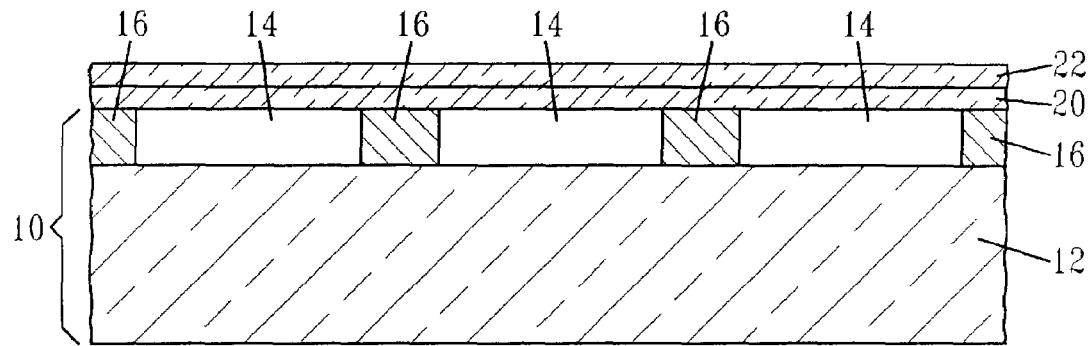

Next, excess precursor gas mixture is evacuated from the reactor chamber and then the structure shown in FIG. 1C is subjected to a plasma treatment to render a top surface portion of dielectric film 20 more dense and less permeable to gases thereby allowing the nitrogen employed in the subsequent step of the present invention to substantially remain at an upper surface of dielectric film. The densified dielectric portion of dielectric layer 20 is labeled as 22 in FIG. 1D. The plasma employed can be any suitable gas, preferably, for example He, and it is typically injected into the reactor for a time period from about 10 to about 60 seconds with the power ranging from about 100 to about 500 watts.

Figure 1E:
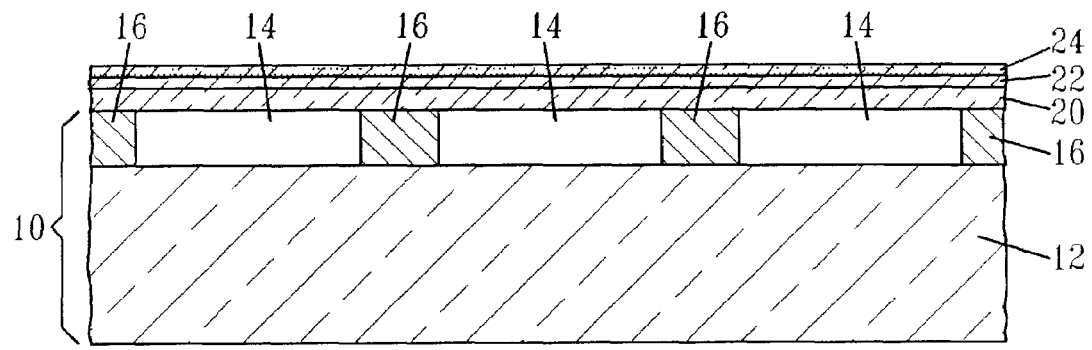

Following plasma treatment, nitrogen atoms are introduced into upper portions of densified dielectric film 22. The upper portion containing the nitrogen atoms is labeled as element 24 in FIG. 1E. The upper portions of the densified dielectric film may also be referred to as a nitrided surface region. The nitrided surface region is formed utilizing the procedure described above in forming optional thin nitrogen-containing film 18. The nitrided surface region has approximately the same thickness and nitrogen content as optional thin nitrogen-containing film 18.

In some embodiments of the present invention, the steps of plasma deposition, plasma treatment and surface nitridation is repeated any number of times. The repeated steps of plasma treatment and nitridation provide a means for incorporating nitrogen atoms into different regions of the dielectric film, which subsequently will be converted into the inventive diffusion barrier. For example, plasma treatment followed by nitridation provides a surface nitride region. Repeated plasma deposition-plasma treatment-nitridation-plasma deposition-plasma treatment-nitridation provides a nitrided surface region and another nitrogen region that is incorporated below the surface nitride region.

The dielectric structure containing the nitrided region(s) and, if present the optional thin nitrogen-containing film, is stabilized before undergoing further integration processing. The stabilization process can be performed in a furnace-annealing step at about 300° C. to about 400° C. for a time period between about 0.5 hours and about 4 hours. The stabilization process can also be performed in a rapid thermal annealing process at temperatures above about 300° C. The stabilization anneal is performed in non-oxidizing ambient such as He, $N_2$, or Ar.

Figure 1F:
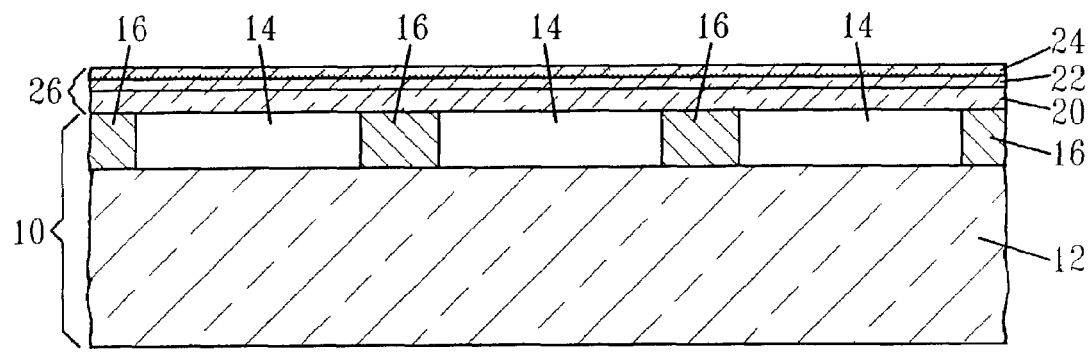

During the annealing process, the dielectric film containing the surface densified and nitrided region is converted into diffusion barrier 26, See FIG. 1F. The diffusion barrier includes a second phase comprised of atoms of least Si, C, H and N, and it has a dielectric constant of less than 3.5, preferably less than 3.0. A further characteristic of the inventive diffusion barrier is that the N atoms are not uniformly distributed within the diffusion barrier. In accordance with the present invention, barrier layer 26 thus include upper nitrogen-containing surface region 24, densified region 22 as well as original dielectric film 20. In the remaining drawings, labels 20, 22 and 24 are omitted, but are nevertheless meant to be included within the inventive diffusion barrier.

The diffusion barrier including the nitrogen-containing regions has a thickness after annealing from about 10 to about 100 nm, with a thickness from about 20 to about 80 nm being more highly preferred. The diffusion barrier typically contains from about 10 to about 40, more preferably from about 20 to about 35 atomic percent Si; from about 15 to about 50, more preferably from about 25 to about 40, atomic percent C; and from about 25 to about 50, more preferably from about 30 to about 45, atomic percent H. The optional element oxygen is present in an amount from about 1 to about 15, more preferably from about 5 to about 10, atomic percent. The optional atoms Ge and/or halogen are present in an amount from about 1 to about 10, more preferably about 5, atomic percent.

The diffusion barrier is further characterized as an amorphous structure, which may further comprise, in at least non-densified layer 20, a multiplicity of nanometer-sized pores. The pores comprise between 0 and 50%, preferably between 0 and 30% of the film's volume. The diameters of these pores are between 0.2 and about 10 nm and preferably between 0.2 and 4 nm.

Figure 1G:
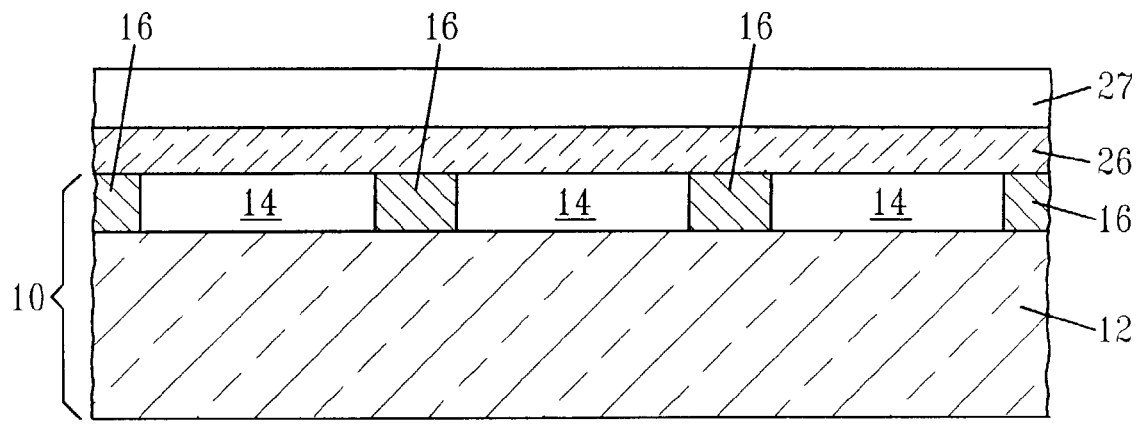

Once the first diffusion barrier has been formed, a second layer of dielectric layer 27 may be formed atop the barrier layer utilizing any of the processing techniques which were used in depositing the first dielectric layer, i.e., dielectric layer 14. In an optional embodiment of the present invention, an adhesion promoter may be formed prior to formation of second dielectric layer 27. Suitable adhesion promoters for use herein include conventional adhesion promoters known to one skilled in the art. Preferred adhesion promoters include organosilanes such as, for example, gamma-amino propylsilane and the like. Techniques for treating the surface of diffusion barrier with an adhesion promoter are within purview of one skilled in the art, for example, by a spin coater or by a PECVD process. Second dielectric layer 27 may be composed of the same or different dielectric as that of first dielectric layer 14. The dielectric layer formed at this point of the present invention typically has a thickness of from about 200 to about 1000 nm, with a thickness of from about 300 to about 700 nm being more highly preferred. The resultant structure containing second dielectric layer 27 is shown, for example, in FIG. 1G.

Figure 1H:
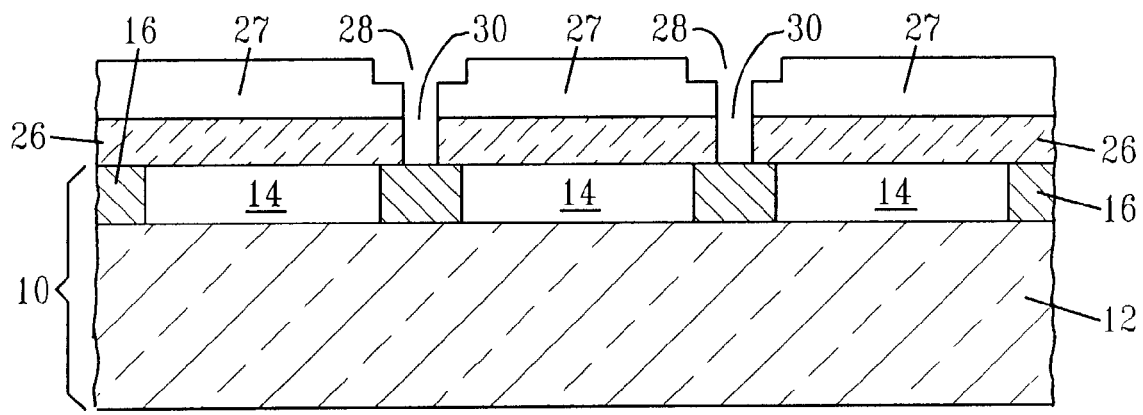

Once second dielectric layer 27 has been formed on the surface of the diffusion barrier, line openings 28 and via openings 30 are then created (by conventional lithography and etching) within second dielectric layer 27 and the diffusion barrier (including surface nitrided regions) to expose the top surface of at least one of the underlying conductive elements. See FIG. 1H. It is particularly advantageous to create line and via openings that are mono and dual damascene (via plus next level conductor) wiring structure for use herein.

Figure 1I:
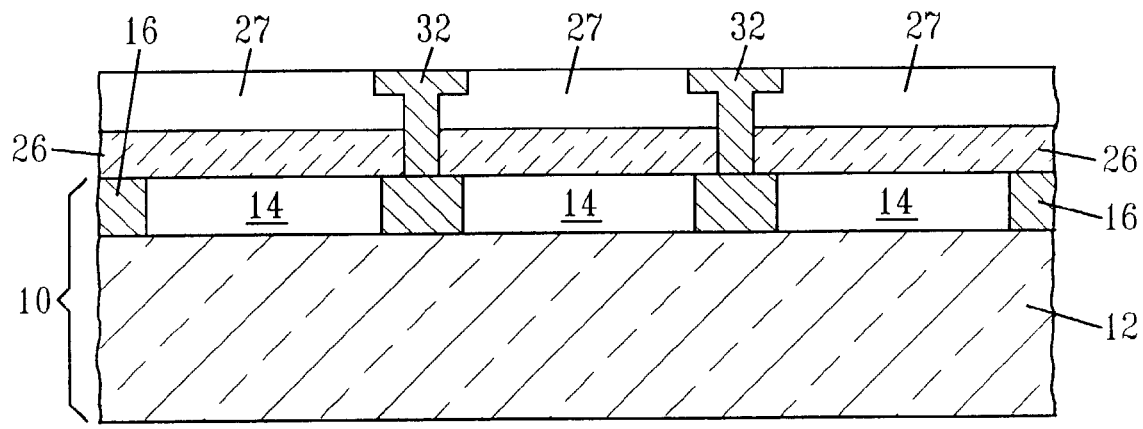

Following the formation of openings 28 and 30, a conductive metal material is deposited within and fills each of the openings to form a second set of conductive elements 32 as is shown, for example, in FIG. 1I. The second set of conductive metal elements can be formed using the same processes as used in forming the previous set of conductive elements. The metal of the second set of conductive elements may be the same or different from the metal used in forming the previous set of conductive elements. Cu is again the preferred material for the second set of conductive elements.

Figure 1J:
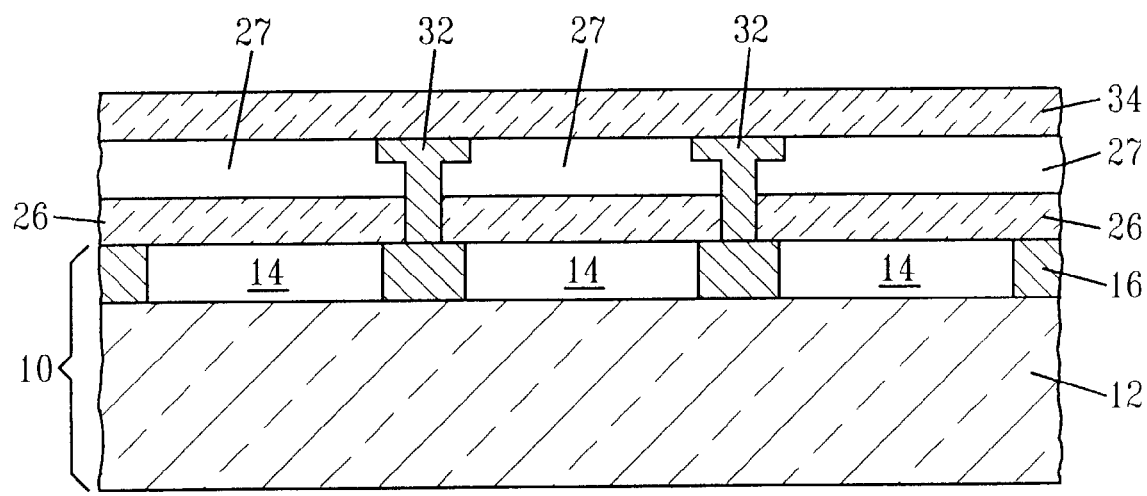

A second diffusion barrier 34 (including non-densified regions, densified regions and nitride surface) can be formed atop the planar surface of the structure shown in FIG. 1I providing the structure shown, for example, in FIG. 1J. The second diffusion barrier is made using the same technique as mentioned above in forming the previous diffusion barrier. Furthermore, the second diffusion barrier is composed of the same basic composition as that of the previous diffusion barrier.

The procedure of forming a dielectric material, creating line and via openings in the dielectric material, filling the openings with a conductive metal material and forming the inventive diffusion barrier atop the surface of the dielectric material containing the conductive elements can be repeated any number of times to provide multi-level wiring structures.

Figure 3A:
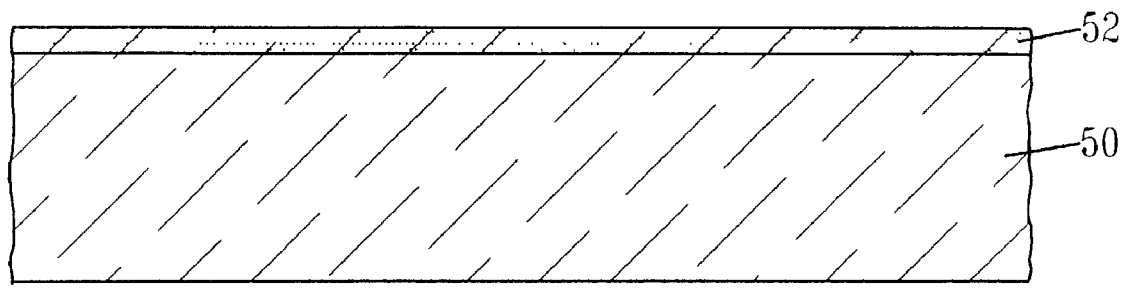
FIGS. 3A-3C are pictorial representations (through cross-sectional views) illustrating different types of diffusion barriers that can be formed using the method of the present invention.
Figure 3B:
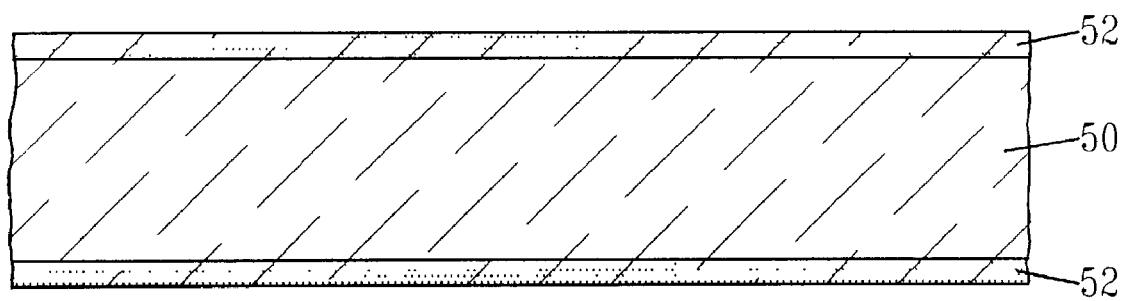
Figure 3C:
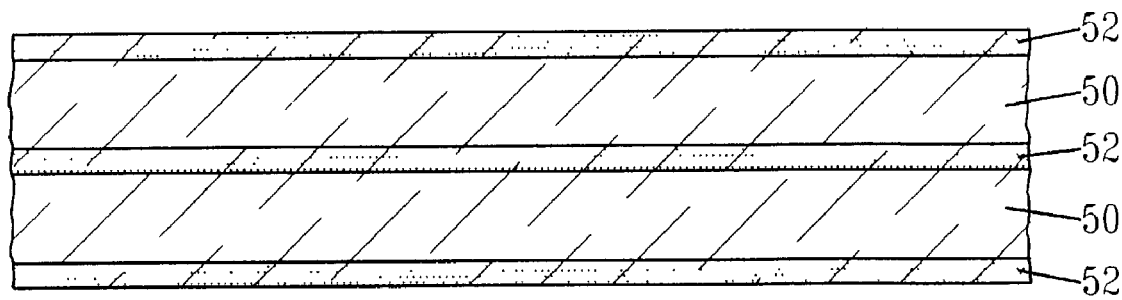

FIGS. 3A-3C (enlarged views) illustrate different types of diffusion barriers that can be formed in the present invention. Reference numeral 50 denotes dielectric material comprised of Si, C and H, optionally O, Ge and/or halogen, while reference numeral 52 denotes regions containing nitrogen-atoms. In FIG. 3A, the nitrogen atoms are located in the upper surface of the diffusion barrier. In FIG. 3B, the nitrogen atoms are present in the lower region and the upper region of the diffusion barrier; while in FIG. 3C, upper, middle and lower regions containing nitrogen atoms are shown.

The following examples are provided to illustrate the fabrication of the inventive diffusion barrier and to demonstrate some advantages that can be obtained therefrom.

EXAMPLE 1

Figure 4:
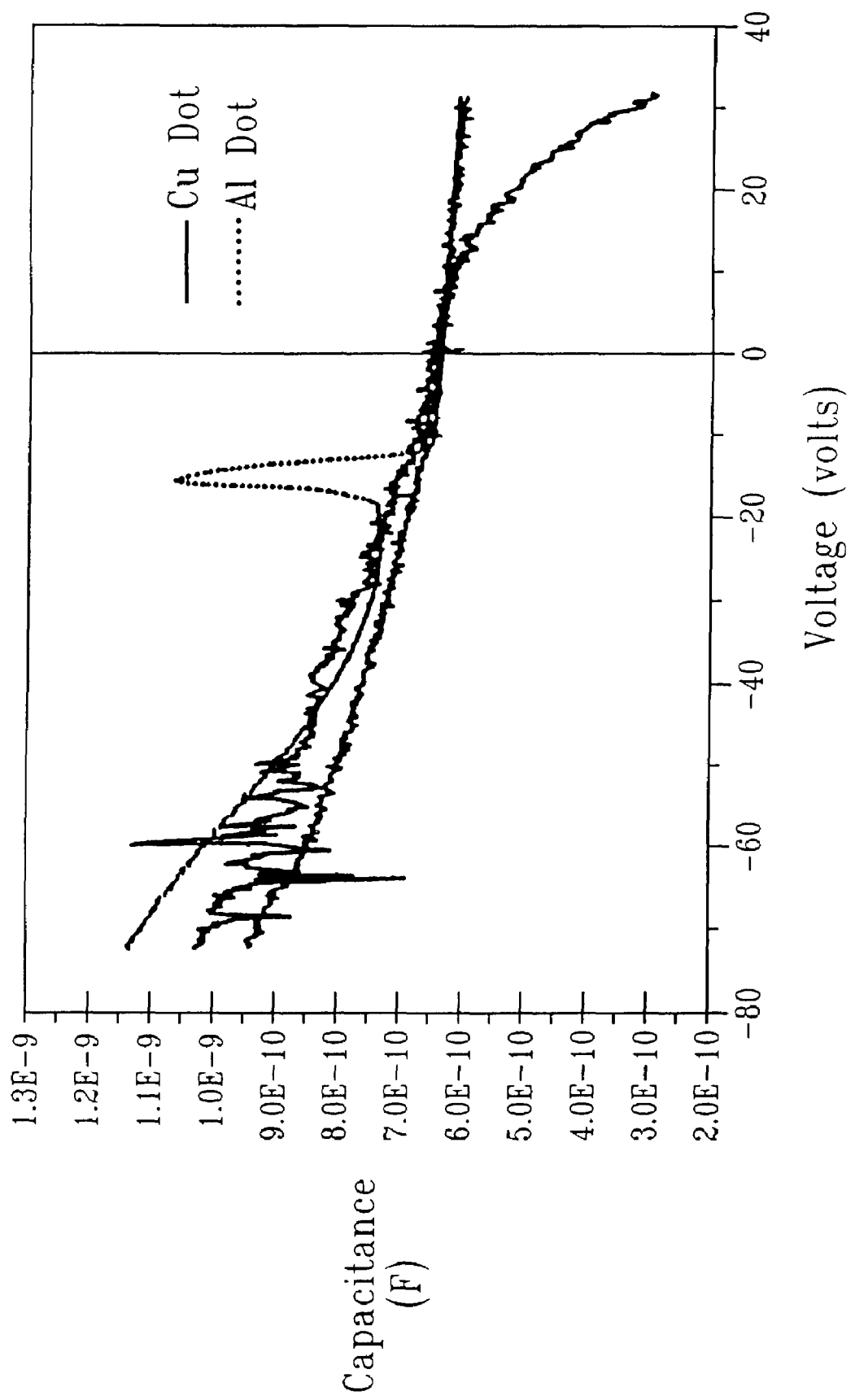
FIG. 4 shows the temperature-bias stress measurements for a diffusion barrier of the present invention.
Figure 5:
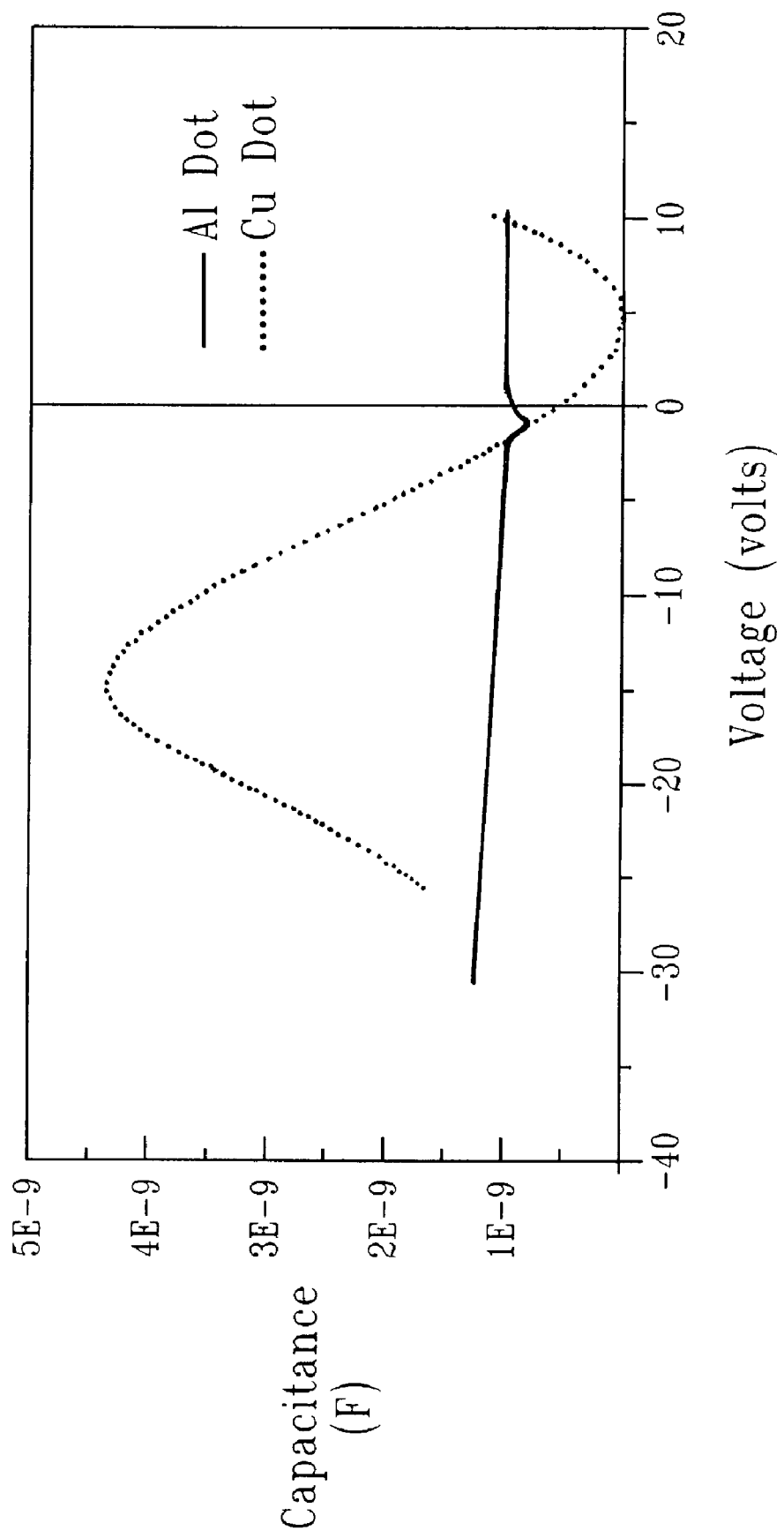
FIG. 5 shows the temperature-bias stress measurements for a control sample with 50 nm oxide prepared from TEOS (tetraethylorthosilicate) on 100 nm thermal oxide.

In order to evaluate the effectiveness of the inventive diffusion barrier, test structures were built. The substrates for these structures consisted of n-type silicon with 1000 Å thick thermally grown $SiO_2$. The control consisted of 500 Å thick TEOS film deposited on the silicon dioxide and the test structure consisted of the inventive diffusion barrier of Example 3 on the silicon dioxide. The inventive diffusion barrier was made in accordance with the present invention. Copper and aluminum dots were deposited on the top surface of each wafer. Triangular Voltage Sweep (TVS) measurements were performed to determine the copper penetration into the underlying $SiO_2$. These measurements are performed at 300° C. and consist of a stress to push $Cu^+$ ions through the barrier and a voltage ramp to measure the current due to the motion of this and other ions. The results, which are shown in FIG. 4, for the barrier sample, and FIG. 5, for the control, show copper penetration only in the TEOS capped control (copper diffusion through TEOS is well known), but not through the barrier film. The curve corresponding to the Al dot in FIG. 4 shows a sodium peak near −15 volts with no other ions present. The curves corresponding to Cu dots do not have any peaks, indicating no or low ($<10^9/cm^2$) Cu penetration. Some noise is seen on one Cu dot curve suggesting leakage at that site. In contrast to that, a large copper signal is easily seen in FIG. 5 as a broad peak between −5 and −25 volts. The TVS measurements thus show that the films of this invention are good diffusion barriers and that the Cu diffusion was below the detection level. The TVS method is more sensitive than many other methods to detect copper mobility through a diffusion barrier film.

EXAMPLE 2

In this example, the substrate was heated to a temperature of 180° C. and the diffusion barrier film was deposited from a mixture of trimethylsilane (3MS)/He/cyclopentene oxide (CPO); flow rate was 10+25+3 sccm, respectively. The pressure in the reactor was controlled at 500 mtorr and the plasma was sustained with an RF generator of 13.56 MHz at 50 W. The film was deposited for 75 seconds to obtain a thickness of 50 nm.

The reactor chamber was then evacuated and the deposited film was exposed for 30 seconds to a He plasma, at a He flow of 40 sccm, 100 mtorr and 50W RF, followed by 1 minute exposure to a plasma of He+NH$_3$=40+10 sccm, 100 mtorr, 50W RF. As a result of these treatments the surface layer of the film was densified and nitrided. The film was then annealed at 400° C. in an inert ambiance.

EXAMPLE 3

In this example, the film has been prepared similar to the procedure in Example 2, but the deposition was done for 37 seconds, followed by the He and He+NH$_3$ plasma treatment and this procedure was repeated twice. The obtained film had about the same total thickness as the film described in Example 2 but had middle and top densified and nitrided layers. The film was then annealed at 400° C. in an inert ambient.

EXAMPLE 4

In yet another example, the substrate was heated to a temperature of 200° C. and the barrier film was deposited from a mixture of 3MS+He+paraxylene=80+200+10 sccm. The pressure in the reactor was controlled at 3 torr and the plasma was sustained with an RF generator of 13.56 MHz at 300 W.

The reactor chamber was then evacuated and the deposited film was exposed for 30 seconds to a He plasma, at an He flow of 200 sccm, 100 mtorr and 50W RF, followed by 1 minute exposure to a plasma of He+NH$_3$=40+10 sccm, 100 mtorr, 50W RF. As a result of these treatments the surface layer of the film was densified and nitrided.

The film was then annealed at 400° C. in an inert atmosphere.

Other conditions for He treatment that may be employed in these examples include:
He flow=100-500 sccm;
Pressure=8.7 torr;
Power=250 Watts;
Time=20 seconds;

and other conditions for the He+NH$_3$ treatment that may be employed in these examples include:
He flow=200 sccm;
NH$_3$ flow=200 sccm;
Pressure=8.7 torr;
Power=250 Watts;
Time=10 seconds.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A composition of matter comprising atoms of at least Si, C, H and N, said N atoms are non-uniformly distributed within the composition, and said composition having a dielectric constant of less than 3.5, being located on a substrate, and having a lower region of dielectric material of a first phase comprised of at least atoms of Si, C and H and an upper region of said dielectric material that has a density that is greater than that of the lower region, said upper region including a nitrided upper surface layer containing said N atoms.

2. The composition of matter of claim 1 wherein said N atoms are further located in a middle densified region of said composition.

3. The composition of matter of claim 2 further comprising said N atoms in said lower region.

4. The composition of matter of claim 1 further comprising said N atoms in said lower region.

5. The composition of matter of claim 1 wherein said lower region comprising a multitude of nanosize pores.

6. The composition of matter of claim 5 wherein said composition has a pore size of from about 0.2 to about 10 nm.

7. The composition of matter of claim 1 wherein said Si atoms are present in an amount from about 10 to about 40 atomic percent; said C atoms are present in an amount from about 15 to about 50 atomic percent; and said H atoms are present in an amount from about 25 to about 50 atomic percent.

8. The composition of matter of claim 1 wherein said Si atoms are present in an amount from about 10 to about 40 atomic percent; said C atoms are present in an amount from about 15 to about 50 atomic percent; said H atoms are present in an amount from about 25 to about 50 atomic percent; and said N atoms are present in an amount from about 1 to about 20 atomic percent.

9. The composition of matter of claim 1 further comprising atoms of O, Ge, halogen or mixtures thereof.

* * * * *